US010629690B2

(12) United States Patent
Meiser et al.

(10) Patent No.: US 10,629,690 B2
(45) Date of Patent: Apr. 21, 2020

(54) SEMICONDUCTOR DEVICE COMPRISING A TRANSISTOR INCLUDING A FIRST FIELD PLATE AND A SECOND FIELD PLATE

(71) Applicant: Infineon Technologies AG, Neubiberg (DE)

(72) Inventors: Andreas Meiser, Sauerlach (DE); Franz Hirler, Isen (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/614,651

(22) Filed: Jun. 6, 2017

(65) Prior Publication Data
US 2017/0358650 A1 Dec. 14, 2017

(30) Foreign Application Priority Data

Jun. 9, 2016 (DE) .................. 10 2016 110 645

(51) Int. Cl.
*H01L 29/66* (2006.01)
*H01L 29/40* (2006.01)
(Continued)

(52) U.S. Cl.
CPC ........ *H01L 29/404* (2013.01); *H01L 29/0878* (2013.01); *H01L 29/10* (2013.01); *H01L 29/407* (2013.01); *H01L 29/41766* (2013.01); *H01L 29/66696* (2013.01); *H01L 29/66704* (2013.01); *H01L 29/7393* (2013.01);
(Continued)

(58) Field of Classification Search
CPC . H01L 29/0696; H01L 29/0878; H01L 29/10; H01L 29/1083; H01L 29/1095; H01L 29/404; H01L 29/407; H01L 29/41766; H01L 29/66696; H01L 29/66704; H01L 29/7393; H01L 29/7816; H01L 29/7825
See application file for complete search history.

(56) References Cited

U.S. PATENT DOCUMENTS 8,541,839 B2 9/2013 Hirler
8,569,842 B2 10/2013 Weis et al.
(Continued)

FOREIGN PATENT DOCUMENTS

DE 10339488 B3 4/2005
DE 102004041198 A1 3/2006
(Continued)

*Primary Examiner* — Meiya Li
(74) *Attorney, Agent, or Firm* — Murphy, Bilak & Homiller, PLLC

(57) ABSTRACT

A semiconductor device includes a transistor in a semiconductor substrate. The transistor includes a drift zone of a first conductivity type adjacent to a drain region, and a first field plate and a second field plate adjacent to the drift zone. The second field plate is arranged between the first field plate and the drain region. The second field plate is electrically connected to a contact portion arranged in the drift zone. The transistor further includes an intermediate portion of the first conductivity type at a lower doping concentration than the drift zone. A distance between the intermediate portion and the drain region is smaller than the distance between the contact portion and the drain region.

11 Claims, 10 Drawing Sheets

(51) Int. Cl.
   *H01L 29/78* (2006.01)
   *H01L 29/08* (2006.01)
   *H01L 29/417* (2006.01)
   *H01L 29/10* (2006.01)
   *H01L 29/739* (2006.01)
   *H01L 29/06* (2006.01)

(52) U.S. Cl.
   CPC ...... *H01L 29/7816* (2013.01); *H01L 29/7825* (2013.01); *H01L 29/0696* (2013.01); *H01L 29/1083* (2013.01); *H01L 29/1095* (2013.01)

(56) References Cited

U.S. PATENT DOCUMENTS

| | | | |
|---|---|---|---|
| 8,716,788 B2 | 5/2014 | Weber et al. | |
| 9,401,399 B2* | 7/2016 | Meiser | H01L 29/407 |
| 9,985,126 B2* | 5/2018 | Meiser | H01L 29/7813 |
| 2002/0155685 A1* | 10/2002 | Sakakibara | H01L 29/0634 |
| | | | 438/500 |
| 2014/0339633 A1* | 11/2014 | Meiser | H01L 29/7825 |
| | | | 257/339 |
| 2015/0145030 A1* | 5/2015 | Meiser | H01L 29/7825 |
| | | | 257/334 |
| 2016/0064559 A1* | 3/2016 | Tsujiuchi | H01L 21/76224 |
| | | | 257/409 |
| 2017/0221885 A1* | 8/2017 | Sander | H01L 27/088 |

FOREIGN PATENT DOCUMENTS

| | | |
|---|---|---|
| DE | 102007020659 A1 | 11/2008 |
| DE | 102007020659 B4 | 2/2012 |

\* cited by examiner

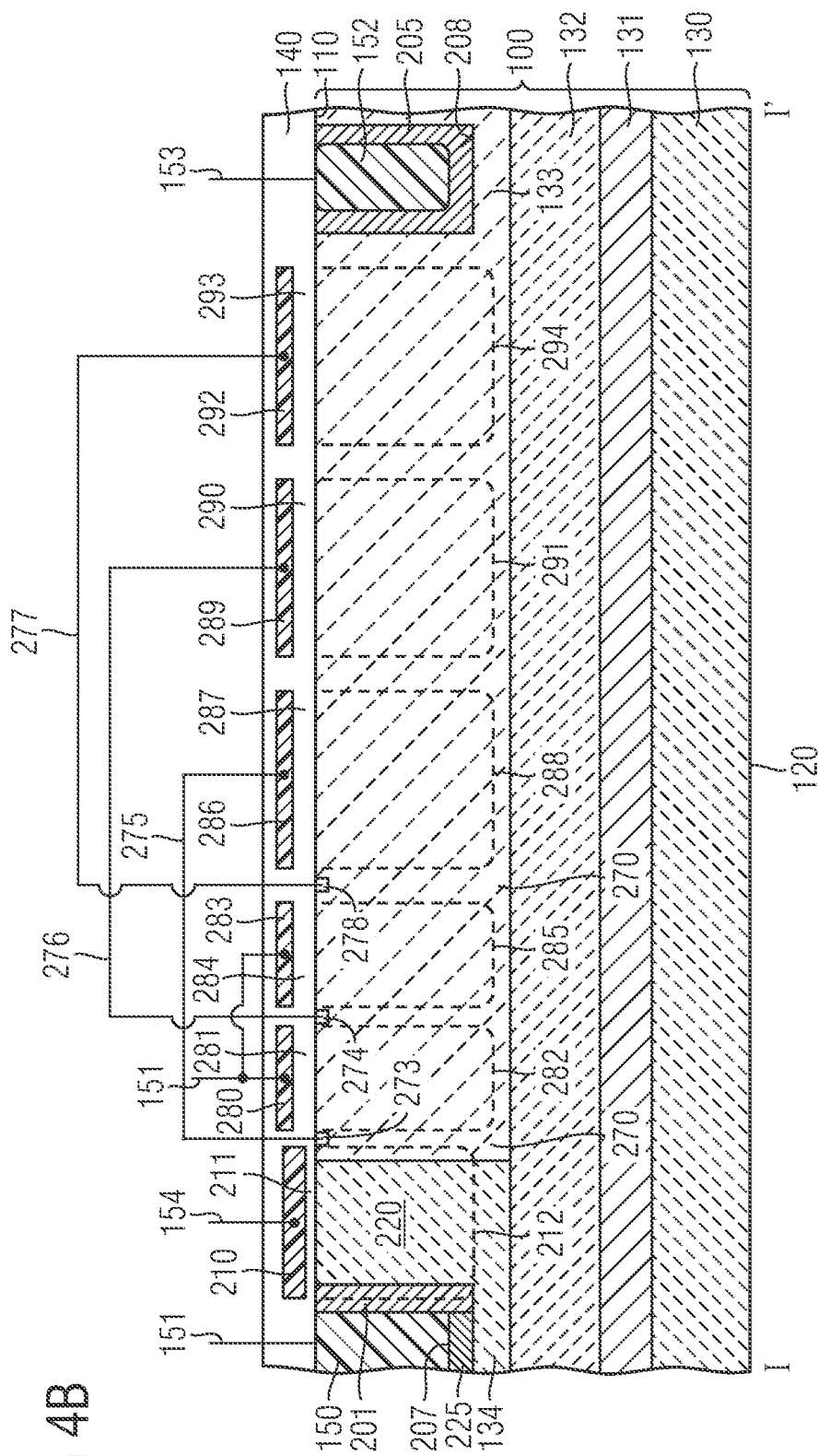

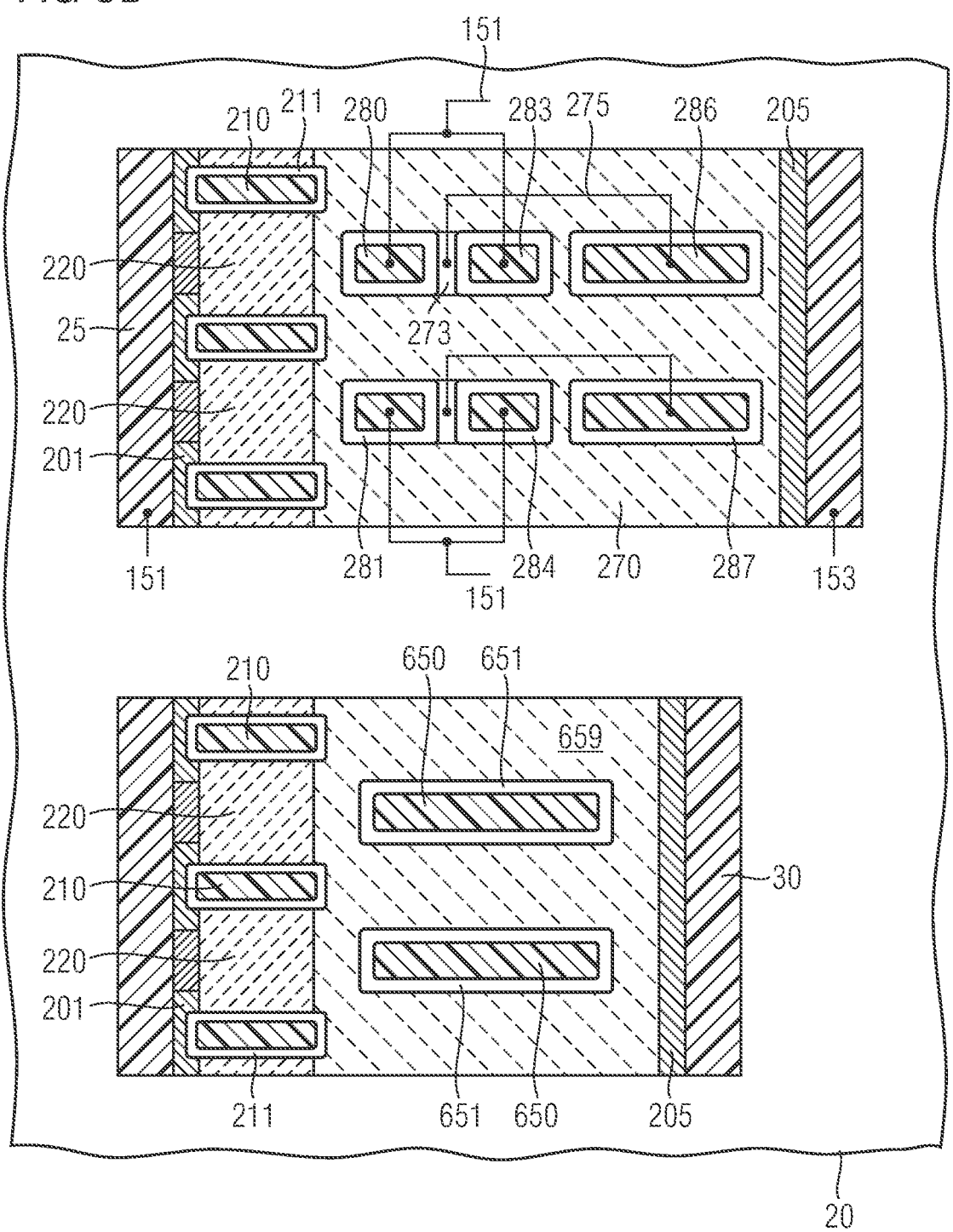

SEMICONDUCTOR DEVICE COMPRISING A TRANSISTOR INCLUDING A FIRST FIELD PLATE AND A SECOND FIELD PLATE

BACKGROUND

Power transistors commonly employed in automotive, industrial and consumer electronics require a low on-state resistance (Ron×A), while securing a high voltage blocking capability. For example, a MOS ("metal oxide semiconductor") power transistor should be capable, depending upon application requirements, to block drain to source voltages $V_{ds}$ of some tens to some hundreds or thousands volts. MOS power transistors typically conduct very large currents which may be up to some hundreds of Amperes at typical gate-source voltages of about 2 to 20 V.

Generally, concepts of transistors having further reduced on-state resistance are being searched for.

It is an object to provide a semiconductor device comprising a transistor having a further reduced on-state resistance.

SUMMARY

According to an embodiment, a semiconductor device comprises a transistor in a semiconductor substrate. The transistor comprises a drift zone of a first conductivity type, adjacent to a drain region, a first field plate and a second field plate adjacent to the drift zone. The second field plate is arranged between the first field plate and the drain region. The second field plate is electrically connected to a contact portion arranged in the drift zone. The transistor further comprises an intermediate portion of the first conductivity type at a lower doping concentration than the drift zone between the contact portion and the drain region.

According to a further embodiment, a semiconductor device comprises a transistor in a semiconductor substrate. The transistor comprises a drift zone consisting of a material of a first conductivity type, a first field plate, a second field plate, a third field plate, and a first contact portion in the drift zone. The first, the second and the third field plates are arranged in a first direction in the drift zone at different distances to a source region. The distance of the third field plate to the source region is larger than the distance of the first or second field plate to the source region, and the third field plate is electrically connected to the first contact portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 4B shows a vertical cross-sectional view of the semiconductor device shown in FIG. 4A.

FIGS. 5A and 5B show schematic views of an integrated circuit according to embodiments.

DETAILED DESCRIPTION

Figure 1A:
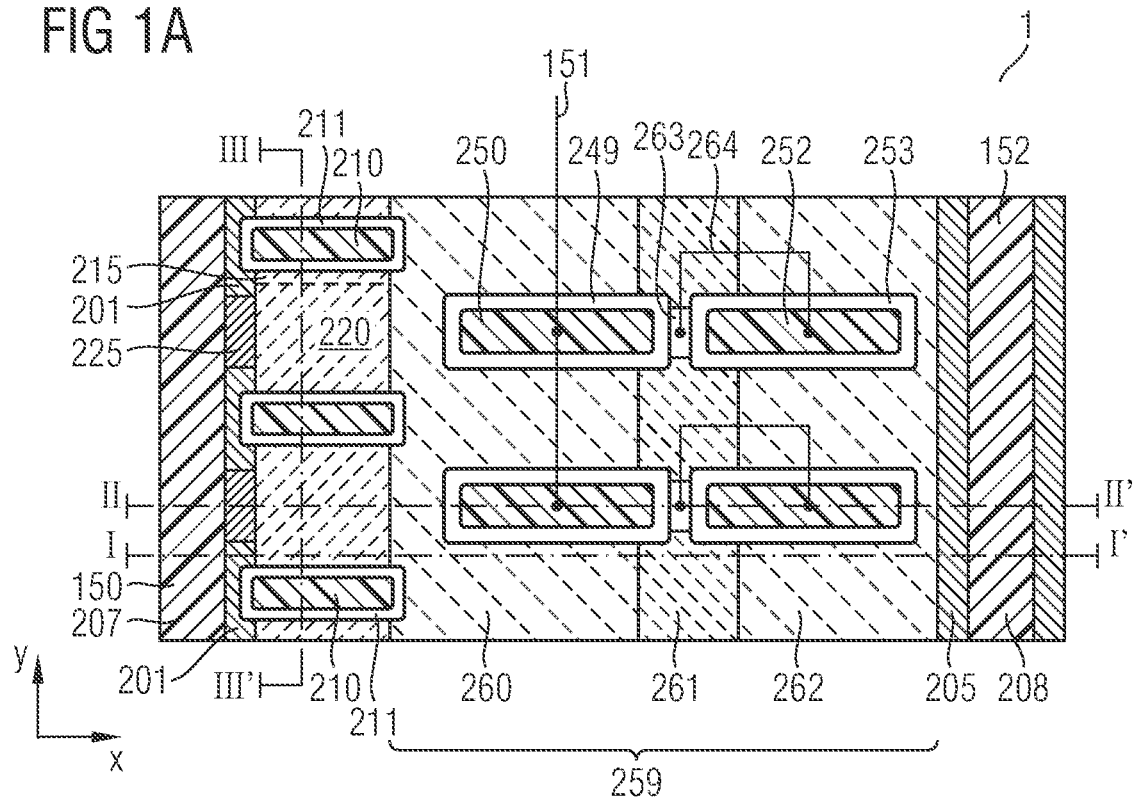
FIG. 1A shows a horizontal cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

In the following, elements of a semiconductor device comprising a transistor, e.g. a power transistor, in a semiconductor substrate will be described. The following description will particularly focus on elements disposed in the drift zone of the transistor. As is readily to be appreciated, the transistor comprises further elements such as a gate electrode, a source region, a drain region and a body region. As to be clearly understood, these elements may be implemented in various manners so as to form a MOSFET ("metal oxide semiconductor field effect transistor"), an IGBT ("bipolar transistor comprising an insulated gate") and others.

FIG. 1A shows a horizontal cross-sectional view of a semiconductor device comprising a transistor according to an embodiment. As will be explained in the following, the semiconductor device comprising a transistor is formed in a semiconductor substrate. The semiconductor device comprises a drift zone 259 of a first conductivity type which is adjacent to a drain region 205. The transistor further comprises a first field plate 250 and a second field plate 252 adjacent to the drift zone. The second field plate 252 is disposed between the first field plate 250 and the drain region 205. The first and the second field plate are arranged in a first direction, e.g. the x direction. The second field plate is electrically connected to a contact portion which is arranged in the drift zone 259. The semiconductor device further comprises an intermediate region 261 of the first conductivity type at a lower doping concentration than the drift zone. The intermediate portion is arranged between the contact portion and the drain region 205.

The transistor shown in FIG. 1A comprises a source region 201 of the first conductivity type, e.g. n-type and a drain region 205 of the first conductivity type. The source region 201 and the drain region 205 may be arranged along the first direction, e.g. the x-direction, parallel to a main surface of a semiconductor substrate. A body region 220 of a second conductivity type, e.g. p-type may be disposed adjacent to the source region 201. A gate electrode 210 is disposed adjacent to the body region 220, the gate electrode 210 being insulated from the body region 220 by means of a gate dielectric layer 211.

The drift zone 259 is disposed between the body region 220 and the drain region 205. The drift zone 259 is doped at the first conductivity type at a lower doping concentration than the drain region 205. The semiconductor device comprises a first field plate 250 and a second field plate 252 which are arranged along the first direction between the body region and the drain region 205 so as to be adjacent to the drift zone 259. The first and the second field plate are insulated from the drift zone 259 by means of a field dielectric layer 249, 253, respectively. The second field plate 252 is electrically connected to a contact portion 263 arranged in the drift zone. For example, the contact portion 263 may be implemented by a doped portion of the first conductivity type having a higher doping concentration than the drift zone 259.

When the transistor is switched on, e.g. by applying a corresponding voltage to the gate electrode 210, a conductive inversion layer is formed at the boundary between the body region 220 and the gate dielectric layer 211. As a consequence, the transistor is in a conducting state. When the transistor is switched off, e.g. by applying a corresponding voltage to the gate electrode 210, no conductive channel is formed at the interface between the body region 220 and the gate dielectric layer 211. Further, carriers of the drift zone are compensated due to the presence of the field plate. According to the embodiment shown in FIG. 1A, the first field plate 250 may be electrically connected to a source terminal 151. As a consequence, the first field plate 250 may be held at source potential. Further, the second field plate 252 is electrically connected to a contact portion arranged in the drift zone 259. As a consequence, the second field plate 252 is not held at a constant potential but is held at a variable potential which depends on the voltage drop across the drift zone 259. As a consequence, a voltage drop between the second field plate 252 and the drain region 205 and, hence, the strength of the electrical field may be reduced in comparison to a case in which the second field plate 252 is held at the source potential. As a result, a thickness of the field dielectric layer 249, 253 may be reduced resulting in an increased width of the drift zone. Further, a doping concentration of the drift zone 259 may be increased in comparison to conventional devices. As a consequence, the on-state resistance (Ron×A) may be further reduced.

As is shown, the second field plate 252 is electrically connected via a conductive element 264 to a contact portion 263. For example, the contact portion 263 may be implemented by a heavily doped portion of the first conductivity type. The conductive element 264 may be implemented by a metal or a heavily doped polysilicon member. The contact portion 263 may be arranged between the first and the second field plates 250, 252. For example, the contact portion 263 may have a lateral extension along a second direction, e.g. the y-direction, which is smaller than a lateral extension of the first field plate 250. Further, the contact portion 263 may be arranged so as not to extend beyond the first and the second field plates 250, 252. Further, the first and the second field plates may be aligned along the first direction. For example, the first and the second field plates 250, 252 may have the same width measured in a lateral direction perpendicular to the first direction, e.g. in the y direction.

The flow of the carriers across the drift zone 259 may not be disturbed by the presence of the contact portion 263 when the contact portion 263 does not extend beyond the first and the second field plates 250, 252. An intermediate portion 261 of the first conductivity type at a lower doping concentration than the drift zone may be arranged between the contact portion 263 and the drain region 205. For example, the intermediate portion may be disposed in a region between the first and the second field plate 250, 252 and may overlap with the first field plate 250 and/or the second field plate 252. According to further embodiments, the intermediate portion 261 does not overlap with the first field plate 250. The contact portion 263 may be arranged adjacent to the intermediate portion 261. According to further embodiments, the drift zone 259 may comprise a first drift zone portion 260, a second drift zone portion 262 and the intermediate portion 261 which is arranged between the first drift zone portion 260 and the second drift zone portion 262. The first drift zone portion 260 may be arranged adjacent to the first field plate 251 and the second drift zone portion 262 may be arranged adjacent to the second field plate 252.

Due to the presence of the intermediate portion, a voltage difference between the potential of the second field plate 252 and the drain potential may be generated. As a consequence, the second drift zone portion 262 adjacent to the second field plate 252 may be efficiently compensated.

According to the embodiment of FIG. 1A, the gate electrodes 210 are disposed so as to be at a position along the second direction between two adjacent first field plates 250. The body region 220 may be electrically connected via a body contact portion 225 to a conductive filling 150 of a source contact groove 207 disposed adjacent to the source region 201. The drain region 205 is electrically connected to a drain contact filling 152 filling e.g. a drain contact groove 208.

Figure 1B:
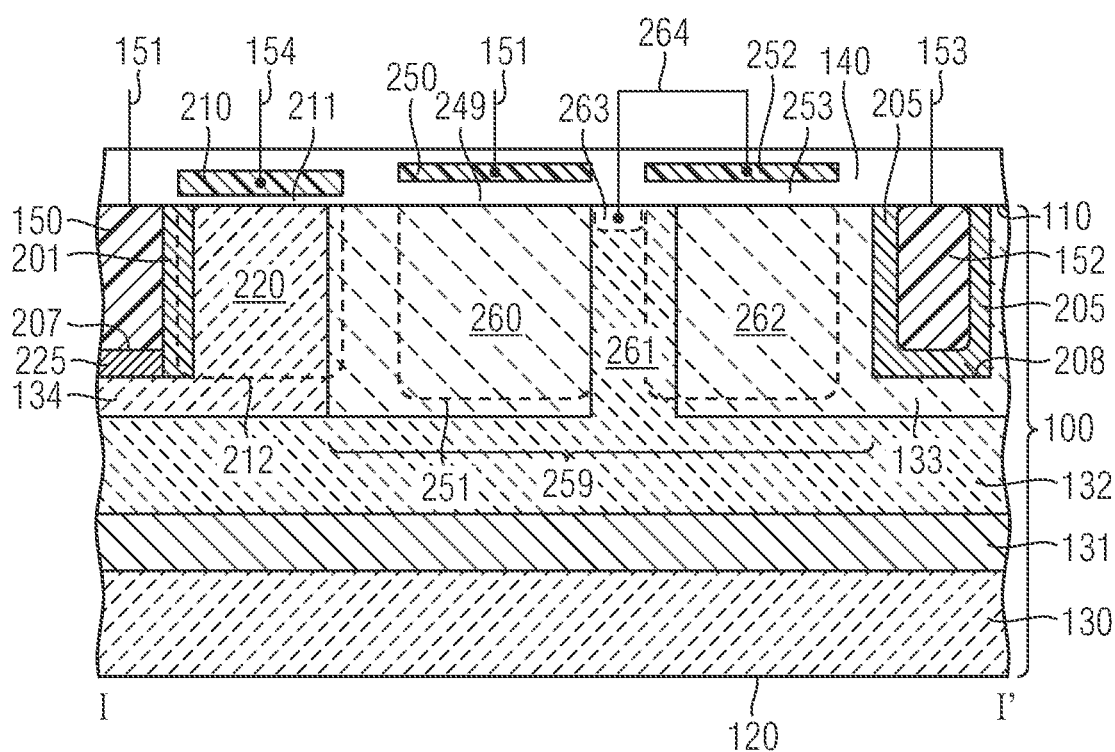
FIG. 1B shows a vertical cross-sectional view of a semiconductor device according to an embodiment.

FIG. 1B shows an example of a vertical cross-sectional view of the semiconductor device shown in FIG. 1A. The semiconductor device 1 is formed in a semiconductor substrate 100 having a first main surface 110. For example, the semiconductor substrate 100 may comprise a substrate layer 130 which may be of the second conductivity type. A buried layer 131 of the first conductivity type may be formed over the substrate layer 130 followed by an epitaxial layer of the first conductivity type 132. As is further shown in FIG. 1B, well portions 133 of the first conductivity type may be formed in the epitaxial layer 132. Further, a well portion 134 of the second conductivity type may be formed in the epitaxial layer 132. The gate electrode 210 may be arranged in gate trenches 212 which are indicated by broken lines and are formed in a plane before and behind the depicted plane of the drawing. The gate electrode 210 extends in the depth direction, e.g. the z-direction as indicated in FIG. 1B. The body region 220 is arranged in the well portion 134 of the second conductivity type. The source region 201 of the first conductivity type may be formed so as to extend in the depth direction. For example, the source region 201 may form a doped sidewall of a source contact groove 207. For example, as is indicated in FIG. 1A, the sidewall of the source contact groove 207 may be alternatingly be doped with different conductivity types so as to alternatingly form the source region 201 of the first conductivity type and the body contact portion 225 of the second conductivity type. According to an embodiment, the body contact portion 225 may be formed at a bottom side of the source contact groove 207. A source contact filling, e.g. a conductive material such as a metal or heavily doped polysilicon may be filled in the source contact groove 207. The source contact filling 150 is electrically connected to a source terminal 151. According to further embodiments, the source contact groove may extend further into the depth direction of the semiconductor substrate. For example, a source contact may be arranged adjacent to the second main surface 120 and no electrical contact may be disposed adjacent to the first main surface 110. According to this embodiment, the contact of the source region 201 to the source terminal 151 may be implemented as a back side contact.

As is further illustrated in FIG. 1B, the drift zone 259 may be arranged in the epitaxial layer 132 of the first conductivity type. The drift zone 259 may comprise a first drift zone portion 260 and a second drift zone portion 262 which are separated from each other by the intermediate portion 261 which forms part of the epitaxial layer 132 of the first conductivity type.

As is further illustrated in FIG. 1B, the first field plate 250 may be arranged in a first field plate trench 251 and the second field plate 252 may be arranged in a second field plate trench 254. The first and the second field plate trenches 251, 254 are formed in the first main surface 110 and are indicated by broken lines in FIG. 1B. The first field plate 250 and the second field plate 252 may have the same length measured in the first direction. Nevertheless, according to further embodiments, the length of the first field plate may be different from the length of the second field plate. By setting the length of the first field plate, a potential difference between the second field plate 252 and the drain region 205 may be determined in a self-controlled manner. As is indicated in FIG. 1B, the first field plate trench 251 and the second field plate trench 254 may extend to a depth within the well portion 133 of the first conductivity type. According to further embodiments, the first field plate trench 251 and the second field plate trench 254 may extend deeper, e.g. to the epitaxial layer 132.

The drain region 205 may be implemented by a doped sidewall portion of a drain contact groove 208. The drain contact groove 208 may be filled with a drain contact material 152, which may be e.g. a metal or a heavily doped polysilicon material. The drain contact material 152 is electrically connected to a drain terminal 153. According to embodiments, the drain terminal 153 may be electrically connected to the drain contact material 152 at the first main surface 110 of the semiconductor substrate. According to further embodiments, the drain contact groove 208 may extend deeply into the semiconductor substrate, and the drain terminal 153 may be electrically connected to a back side or second main surface 120 of the semiconductor substrate. For example, the contact of the drain region 205 to a drain terminal 153 may be implemented as a back side contact.

Figure 1C:
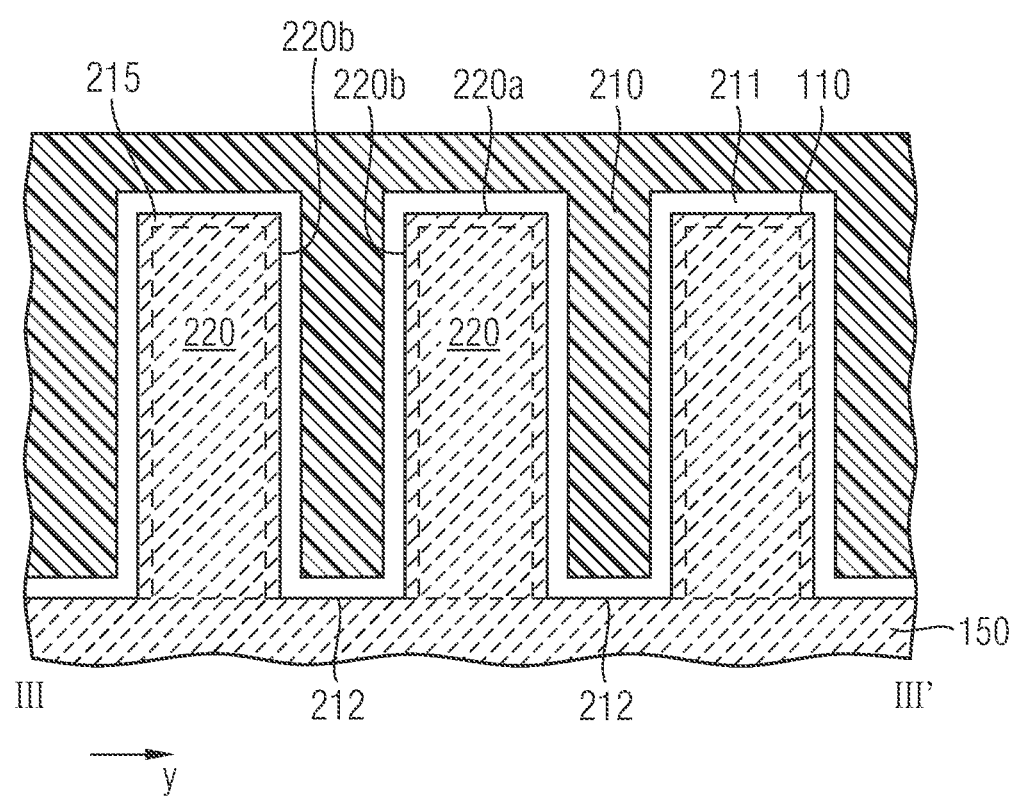
FIG. 1C shows a vertical cross-sectional view of the semiconductor device taken along a second direction.

FIG. 1C shows an example of a configuration of the gate electrodes 210 disposed in gate trenches 212. The cross-sectional view of FIG. 1C is taken between III and III' so as to intersect a plurality of gate trenches 212. As is shown in FIG. 1C, the gate electrode 210 may be disposed adjacent to sidewalls of the body region 220. As a consequence, a conductive channel 215 may be disposed adjacent to a sidewall 220b of the body region and adjacent to a top side 220a of the body region 220.

Figure 1D:
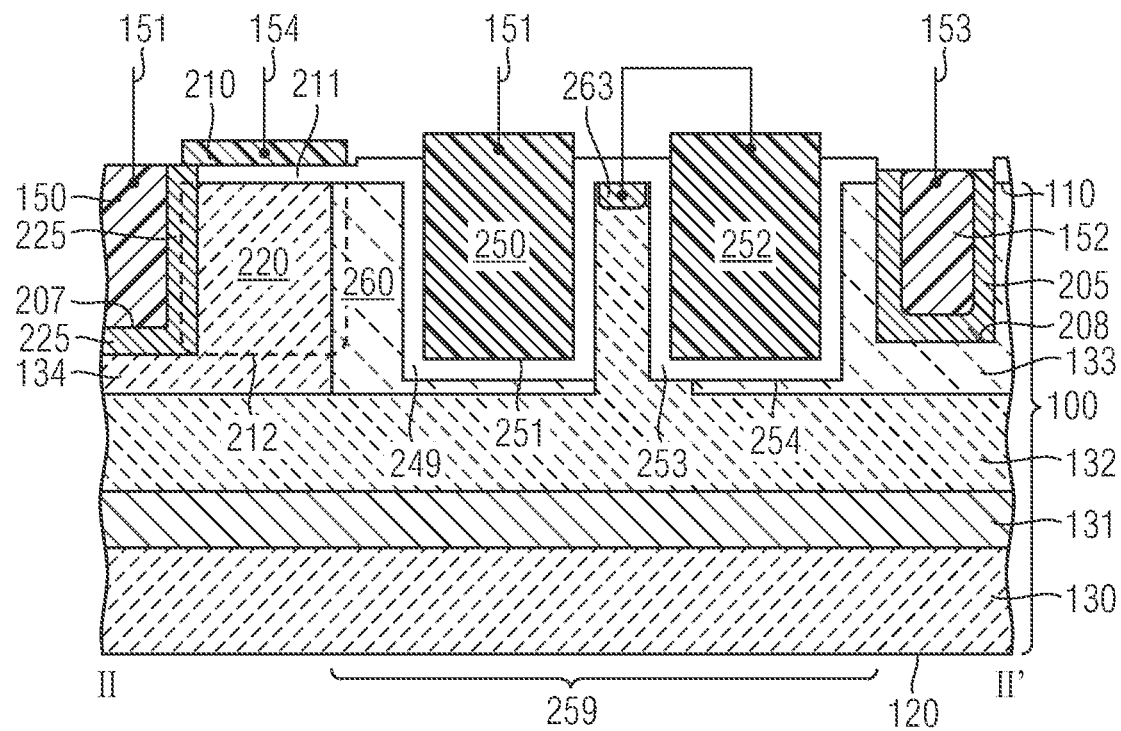
FIG. 1D shows a further cross-sectional view of the semiconductor device shown in FIG. 1A.

FIG. 1D shows a cross-sectional view of the semiconductor device between II and II' so as to intersect the first field plate trench 251 and the second field plate trench 254. Differing from the cross-sectional view shown in FIG. 1B, the body contact portion 225 of the second conductivity type is disposed adjacent to the sidewall of the source contact groove 207. Further, the first field plate trench 251 and the second field plate trench 254 are arranged in the first main surface 110 of the semiconductor substrate and are filled with a conductive material. The contact portion 263 is disposed between the first field plate trench 251 and the second field plate trench 254.

Figure 1E:
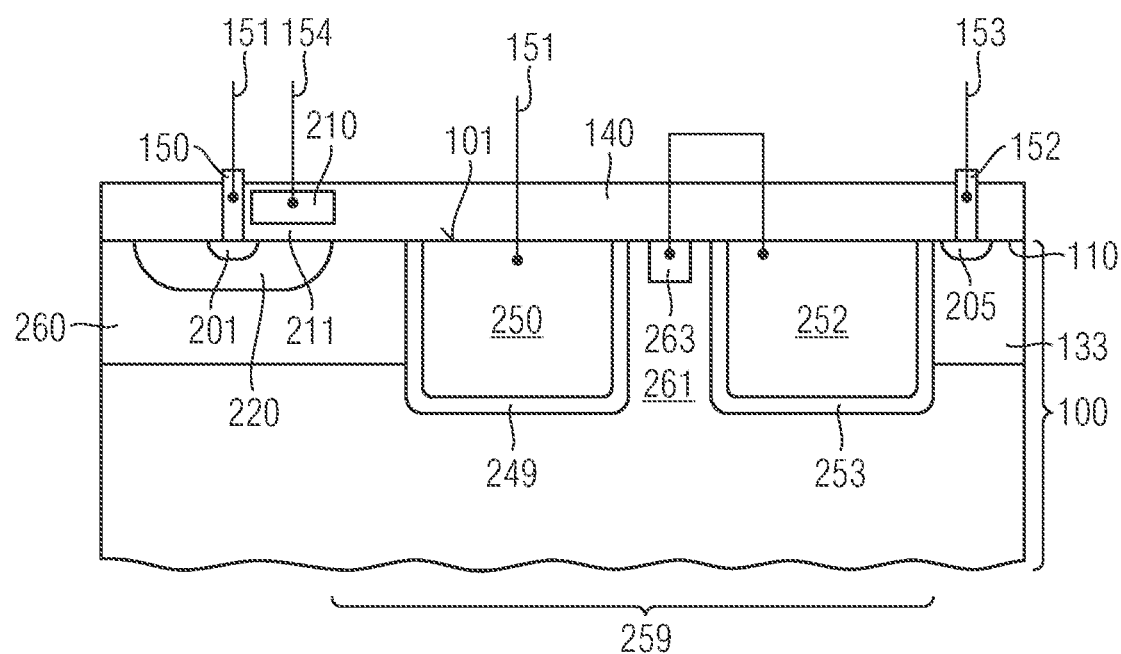
FIG. 1E shows a cross-sectional view of a modification of the semiconductor device shown in FIGS. 1B and 1D.

FIG. 1E shows a further embodiment of a semiconductor device. Differing from the embodiment shown in FIG. 1A the gate electrode 210 is implemented as a planar gate electrode. In particular, the gate electrode 210 is entirely disposed over the first main surface 110 of the semiconductor substrate. Further, the source contact filling 150 is not disposed in a source contact trench formed in the semiconductor substrate 100 but is disposed over the first main surface 110 of the semiconductor substrate 100. In a corresponding manner, the drain contact filling is disposed over the semiconductor substrate 100 and does not extend into the semiconductor substrate 100.

Figure 2A:
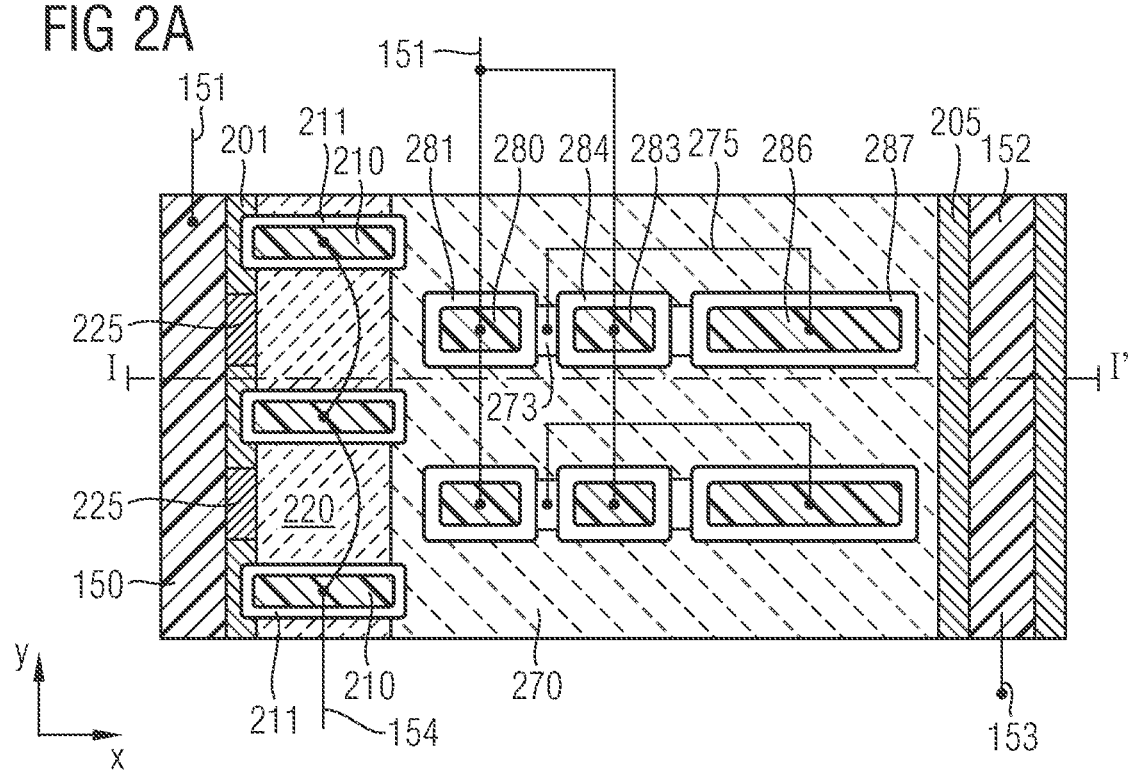
FIG. 2A shows a horizontal cross-sectional view of a semiconductor device according to a further embodiment.
Figure 2B:
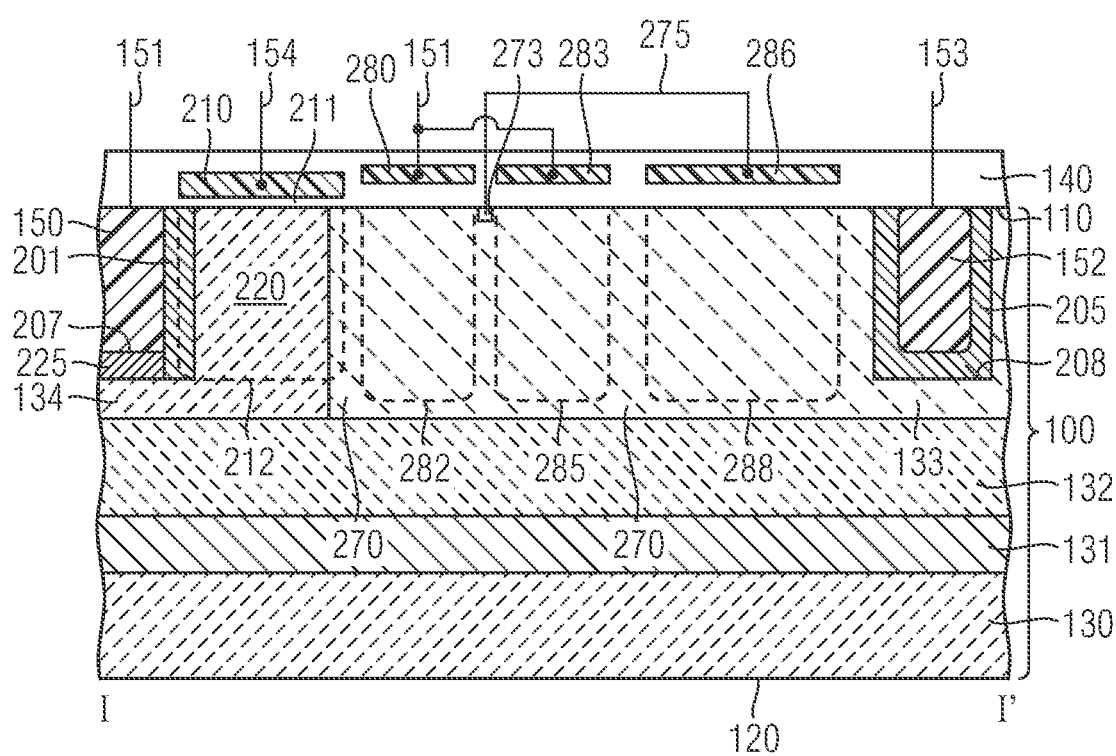
FIG. 2B shows a vertical cross-sectional view of the semiconductor device shown in FIG. 2A.

FIGS. 2A and 2B illustrate views of a semiconductor device according to a further embodiment. As will be explained in the following, the semiconductor device illustrated in FIGS. 2A and 2B comprises a transistor comprising a drift zone 270 that consists of a material of a first conductivity type. The semiconductor device further comprises a first field plate 280, a second field plate 283 and a third field plate 286. The transistor further comprises a first contact portion 273 in the drift zone 270. The first, the second and the third field plates are arranged in a first direction in the drift zone 270 at different distances to a source region 201. The distance of the third field plate 286 to the source region 201 is larger than the distance of the first 280 or second field plate 283 to the source region 201. Further, the third field plate 286 is electrically connected to the first contact portion 273.

The transistor illustrated in FIG. 2A comprises similar elements as the transistor illustrated in FIG. 1A, e.g. the source region 201, the body contact portion 225, the source contact filling 150, the body region 220, the gate electrode 210 and the drain region 205, so that a detailed description thereof will be omitted. Differing from the embodiment shown in FIGS. 1A and 1B, the transistor comprises a first field plate 280 and a second field plate 283 which may be e.g. electrically connected to a source terminal 151. Further, the third field plate 286 which may be e.g. disposed between the second field plate 283 and the drain region 205 is electrically connected to the first contact portion 273 which is arranged in the drift zone. For example, the first contact portion 273 may be disposed between the first field plate 280 and the second field plate 283. In a similar manner as has been discussed above with reference to FIG. 1A, the first contact portion 273 may be arranged so that it does not extend along the second direction, e.g. the y-direction beyond the first field plate 280 and the second field plate 283. As a consequence, the first contact portion 273 does not affect the operability of the drift zone 270. The first contact portion may be implemented by a heavily doped portion of the first conductivity type in a similar manner as has been discussed above with reference to FIGS. 1A to 1E. The first contact portion may be arranged on a side of the first field plate 280 adjacent to the body region 220, according to a further embodiment. According to an embodiment, the first, second and third field plates 280, 283 and 286 may have the same width measured in a second lateral direction, e.g. in the y direction.

FIG. 2B shows a vertical cross-sectional view of the semiconductor device shown in FIG. 2A. In FIG. 2B, the same elements as illustrated in FIG. 1B are designated by the same reference numerals, and a detailed description thereof will be omitted for the sake of simplicity. According to the embodiment of FIG. 2B, an intermediate portion 261 of a lower doping concentration may be absent from the drift zone 270. Further, the drift zone 270 consists of a material of the first conductivity type. Within the context of the present disclosure, the term "a drift zone consisting of a material of a first conductivity type" is intended to mean, that the drift zone does not comprise portions of the second conductivity type. As is shown in FIGS. 2A and 2B, the first contact portion of the first conductivity type as well as field plates may be arranged in the drift zone 270. The field plates may be arranged in corresponding field plate trenches 282, 285, 288 that are formed in the first main surface 110 of the semiconductor substrate 100. The field plate trenches 282, 285, 288 are indicated by broken lines and are arranged before and behind the shown drawing plane. For example, the first field plate 280 and the second field plate 283 may have the same length measured in the first direction. Further, the length of the first and second field plates may be smaller than the length of the third field plate 286. In a corresponding manner as has been explained with reference to FIG. 1B, by setting the lengths of the field plate trenches, a potential difference between the third field plate 286 and the drain region 205 may be set in a self-controlled manner.

According to an embodiment, the drift zone 270 does not comprise an intermediate portion 261 of a lower doping concentration. As a consequence, the on-state resistance of the transistor may be further reduced. For example, when the first contact portion 273 is disposed between the first field plate 280 and the second field plate 283, a desired difference between the potential of the third field plate and the drain potential may be achieved so that the drift zone adjacent to the third field plate 286 may be efficiently compensated. The third field plate 286 may be electrically connected to the first contact portion 273 by means of a first conductive element 275 which may be implemented by a metal member or a member of heavily doped polysilicon.

Figure 3A:
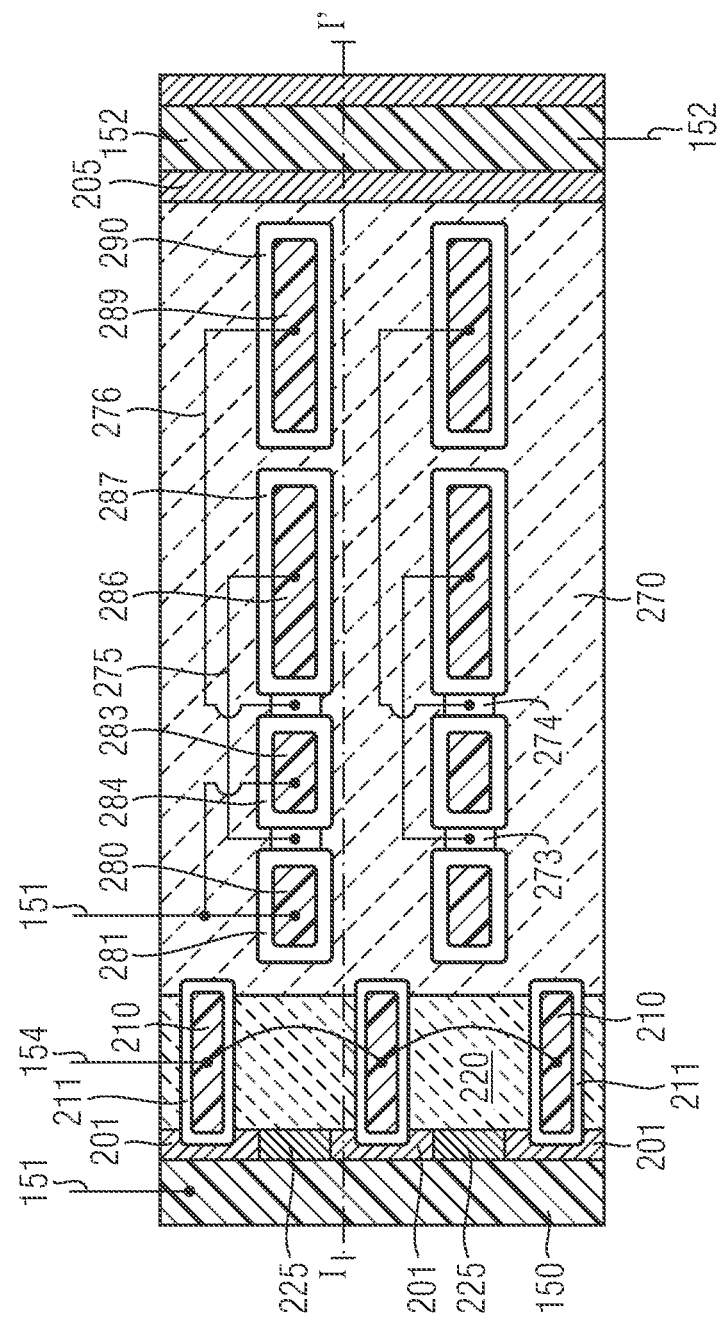
FIG. 3A shows a horizontal cross-sectional view of a semiconductor device according to a further embodiment.
Figure 3B:
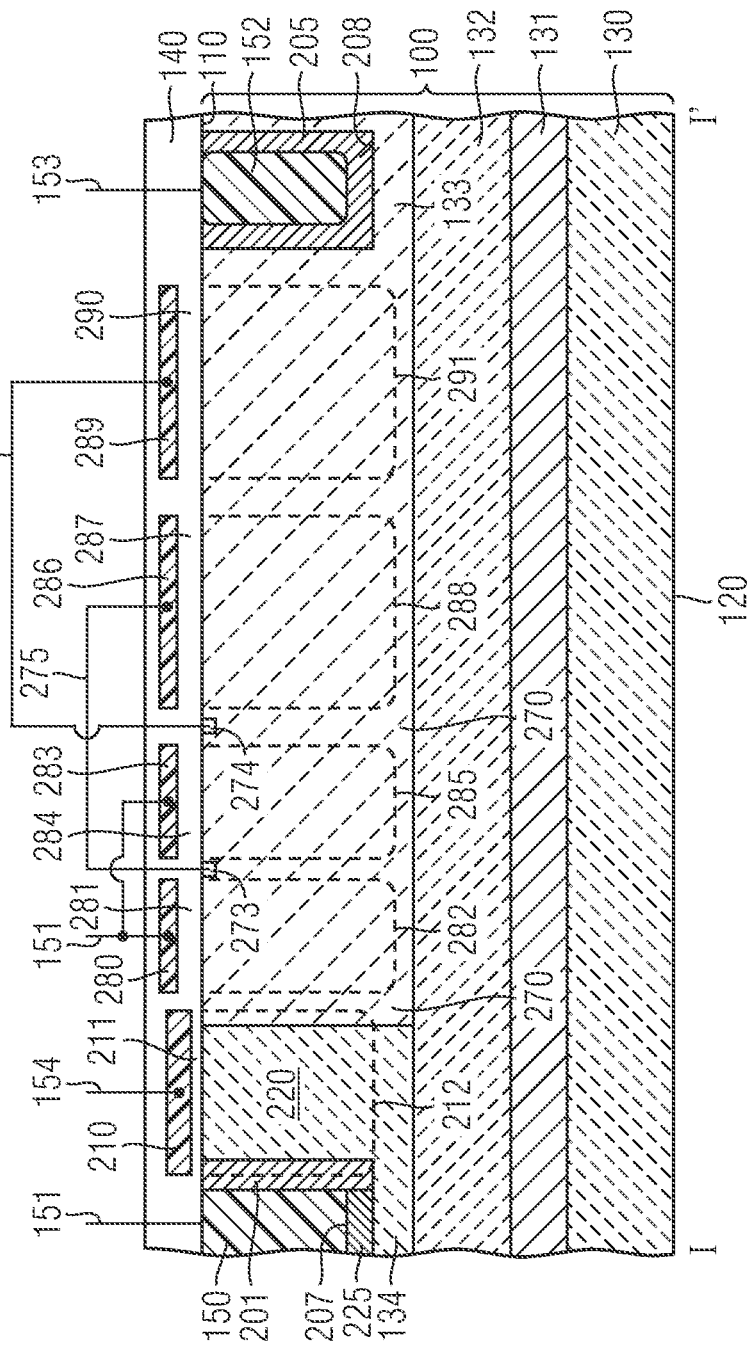
FIG. 3B shows a vertical cross-sectional view of the semiconductor device shown in FIG. 3A.

The concept explained with reference to FIGS. 2A and 2B may be extended to a semiconductor device comprising further field plates. For example, as is illustrated in FIGS. 3A and 3B, the semiconductor device may further comprise a fourth field plate 289, which may be electrically connected to a second contact portion 274, e.g. by means of a second conductive element 276. The second field plate 289 may be insulated from the drift zone 270 by means of a second field dielectric layer 290. As is illustrated in FIG. 3B, the fourth field plate 289 may be arranged in a fourth field plate trench 291. The second contact portion 274 may be arranged between the second field plate 283 and the third field plate 286.

Figure 4A:
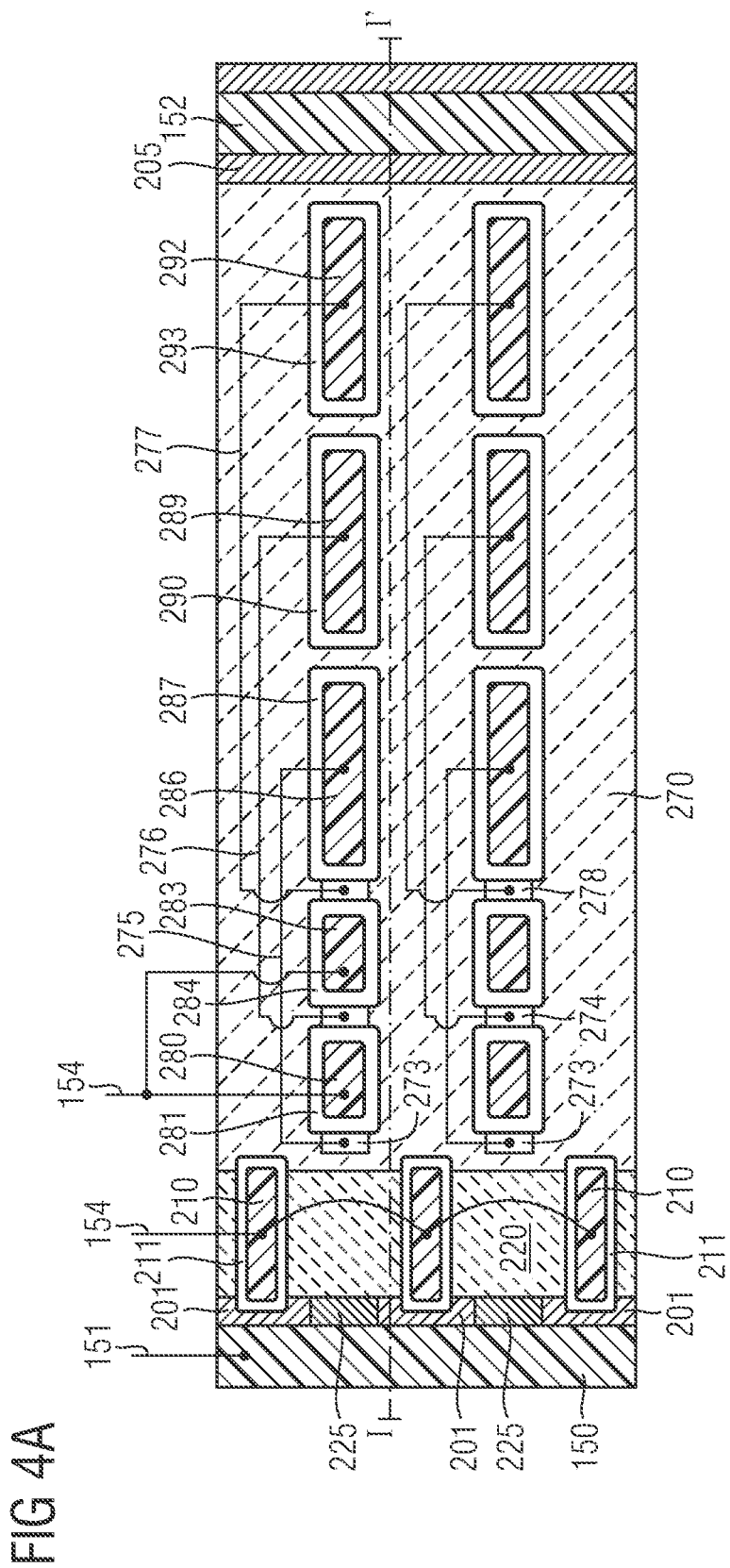
FIG. 4A shows a horizontal cross-sectional view of a semiconductor device according to a further embodiment.

According to the embodiment illustrated in FIGS. 4A and 4B, the semiconductor device further comprises a fifth field plate 292. According to a further modification, differing from the embodiments illustrated before, the first contact portion 273 may be arranged between the first field plate 280 and the body region 220. In a corresponding manner, the second contact portion is arranged between the first field plate 280 and the second field plate 283. The third contact portion 278 is arranged between the second field plate 283 and the third field plate 286. As a consequence, the potential difference between the respective field plates and the drain region 205 may be further increased, resulting in a more efficient compensation of the drift zone portion adjacent to the respective field plates. According to a further embodiment, the semiconductor device comprises a fifth field plate 292, and the first contact portion is arranged between the first field plate 280 and the second field plate 283 in a similar manner as has been described with reference to FIGS. 3A and 3B.

Figure 5A:
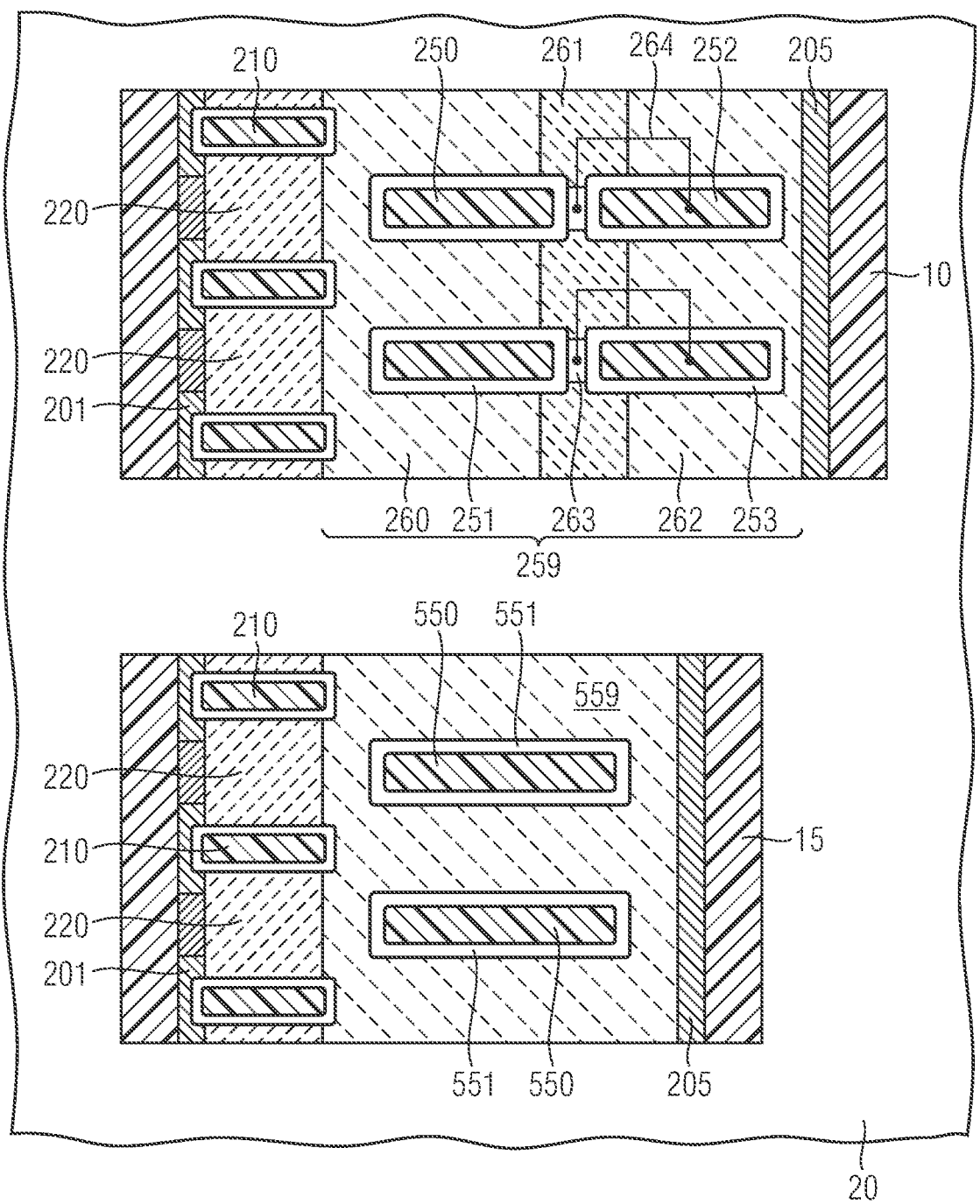

FIG. 5A shows a schematic horizontal cross-sectional view of an integrated circuit 20 according to an embodiment. The integrated circuit 20 comprises a first power transistor 10 and a second power transistor 15 that may be formed in a single semiconductor substrate 100. For example, the first transistor 10 may be implemented in the manner as has been described with reference to FIGS. 1A to 1E. The components of the first transistor 10 being a component of the integrated circuit 20 of FIG. 5A may have corresponding elements that have been described with reference to FIGS. 1A to 1E so that a detailed description thereof is omitted. For example, the length of the drift zone 259 may be selected so as to achieve breakdown characteristics of a corresponding first voltage class. The second transistor 15 may be different from the first transistor 10. For example, the second transistor 15 may comprise a single field plate 550 that extends along the drift zone 559. The length of the drift zone 559 of the second transistor 15 may be selected so as to achieve breakdown characteristics of a corresponding second voltage class. For example, the length of the drift zone 559 of the second transistor may be shorter than the length of the drift zone 259 of the first transistor 10. According to an embodiment, the first and the second transistors may be formed using common or joint processing methods. For example, the drift zone 259 of the first transistor 10 and the drift zone 559 of the second transistor 15 may have the same doping level. Further, a thickness of the first field dielectric layer 249 and the second field dielectric layer 253 of the first transistor 10 may be equal to a thickness of the field dielectric layer 551 of the second transistor 15. As a consequence, an integrated circuit 20 comprising a first transistor 10 and a second transistor 15, each having different breakdown characteristics may be manufactured using a simplified process.

FIG. 5B shows a schematic horizontal cross-sectional view of an integrated circuit 20 according to a further embodiment. The integrated circuit 20 comprises a first power transistor 25 and a second power transistor 30 that may be formed in a single semiconductor substrate 100. For example, the first transistor 25 may be implemented in the manner as has been described with reference to FIGS. 2A to 4B. The components of the first transistor 25 being a component of the integrated circuit 20 of FIG. 5B may have corresponding elements that have been described with reference to FIGS. 2A to 4B so that a detailed description thereof is omitted. For example, the length of the drift zone 259 may be selected so as to achieve breakdown characteristics of a corresponding first voltage class. The second transistor 30 may be different from the first transistor 25. For example, the second transistor 30 may comprise a single field plate 650 that extends along the drift zone 659. The length of the drift zone 659 of the second transistor 30 may be selected so as to achieve breakdown characteristics of a corresponding second voltage class. For example, the length of the drift zone 659 of the second transistor 30 may be shorter than the length of the drift zone 259 of the first transistor 25. According to an embodiment, the first and the second transistors may be formed using common or joint processing methods. For example, the drift zone 259 of the first transistor 25 and the drift zone 659 of the second transistor 30 may have the same doping level. Further, a thickness of the first field dielectric layer 281, the second field dielectric layer 284 and the third field dielectric layer 287 of the first transistor 25 may be equal to a thickness of the field dielectric layer 651 of the second transistor 30. As a consequence, an integrated circuit 20 comprising a first transistor 25 and a second transistor 30, each having different breakdown characteristics may be manufactured using a simplified process.

For example, the integrated circuits 20 shown in FIGS. 5A and 5B may implement as a smart power application. The integrated circuits 20 may be used as converters or as drivers, e.g. hard disk drivers.

As has been described herein before, the semiconductor device comprises a first field plate which may be electrically connected to a source terminal and further field plates which may be electrically connected to a variable potential by means of a contact element disposed in the drift zone. As a result, a doping concentration of the drift zone may be increased and, hence, the on-state resistance of the transistor may be remarkably reduced. Further, a thickness of the field dielectric layer may be reduced resulting in an increased effective width of the drift zone. Hence, the on-state resistance of the transistor may be further increased. As a general concept, the field plate is split into several sub-field plates comprising a first field plate which is electrically connected to a source terminal. The further field plates may be held at a variable potential. According to further embodiments, the first field plate may be electrically connected to a terminal different from the source terminal. Moreover, several transistors having different voltage classes may be combined in a single integrated circuit without the need of performing additional process steps for every single transistor.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising:
   a transistor in a semiconductor substrate, the transistor comprising:
   a drift zone of a first conductivity type, adjacent to a drain region;
   a contact portion arranged in the drift zone;
   a first field plate and a second field plate adjacent to the drift zone, the second field plate being arranged between the first field plate and the drain region, the second field plate being electrically connected to the contact portion; and
   an intermediate portion of the first conductivity type having a doping concentration lower than that of the drift zone,
   wherein a distance between the intermediate portion and the drain region is smaller than a distance between the contact portion and the drain region.

2. The semiconductor device of claim 1, wherein the drift zone and the drain region are arranged in a first direction parallel to a first main surface of the semiconductor substrate, the first field plate and the second field plate being arranged in the first direction.

3. The semiconductor device of claim 2, wherein a lateral extension of the contact portion in a lateral direction perpendicular to the first direction is smaller than a lateral extension of any of the first field plate and the second field plate.

4. The semiconductor device of claim 2, wherein the first field plate and the second field plate have a same length measured in the first direction.

5. The semiconductor device of claim 2, wherein the first field plate and the second field plate have a same width measured in a second lateral direction perpendicular to the first direction.

6. The semiconductor device of claim 2, wherein the first field plate is arranged in a first field plate trench in the first main surface and the second field plate is arranged in a second field plate trench in the first main surface, and wherein a depth of the first field plate trench is equal to a depth of the second field plate trench.

7. The semiconductor device of claim 1, wherein the contact portion is disposed between the first field plate and the second field plate.

8. The semiconductor device of claim 1, wherein the intermediate portion overlaps with the first field plate and the second field plate.

9. An integrated circuit comprising the semiconductor device of claim 1.

10. The integrated circuit of claim 9, further comprising a second transistor formed in the semiconductor substrate.

11. The integrated circuit of claim 10, wherein a length of the drift zone of the transistor is different from a length of the drift zone of the second transistor.

\* \* \* \* \*